(12) United States Patent
Krishnamurthy et al.

(10) Patent No.: US 12,259,746 B1
(45) Date of Patent: Mar. 25, 2025

(54) DYNAMIC CLOCK SCALING USING COMPRESSION AND SERIALIZATION

(71) Applicant: Synopsys, Inc., Sunnyvale, CA (US)

(72) Inventors: Pramod Bettagere Krishnamurthy, Bangalore (IN); Sunil Raidurgam Venkat, Bangalore (IN)

(73) Assignee: Synopsys, Inc., Sunnyvale, CA (US)

( * ) Notice: Subject to any disclaimer, the term of this patent is extended or adjusted under 35 U.S.C. 154(b) by 266 days.

(21) Appl. No.: 17/858,856

(22) Filed: Jul. 6, 2022

Related U.S. Application Data

(60) Provisional application No. 63/218,849, filed on Jul. 6, 2021.

(51) Int. Cl.
| | |
|---|---|
| *H04B 1/66* | (2006.01) |
| *G06F 1/08* | (2006.01) |
| *G06F 1/10* | (2006.01) |
| *H03M 7/30* | (2006.01) |

(52) U.S. Cl.
CPC .............. *G06F 1/08* (2013.01); *G06F 1/10* (2013.01); *H03M 7/30* (2013.01)

(58) Field of Classification Search
CPC ....... H04B 10/66; H04L 7/0008; H04L 7/033; H03M 9/00; G06F 30/331; G06F 13/4018; G06F 1/12; H04J 3/0685
USPC .......................................................... 375/240
See application file for complete search history.

(56) References Cited

U.S. PATENT DOCUMENTS

| | | | |
|---|---|---|---|
| 8,503,593 B2 * | 8/2013 | Katz | G06F 1/10 370/516 |
| 9,002,693 B2 * | 4/2015 | Asaad | G06F 30/331 703/15 |
| 2008/0107422 A1 * | 5/2008 | Cole | H04J 3/047 398/135 |
| 2016/0087764 A1 * | 3/2016 | Tsuchiya | H03K 5/135 375/295 |

* cited by examiner

*Primary Examiner* — Khai Tran
(74) *Attorney, Agent, or Firm* — Weaver Austin Villeneuve & Sampson LLP

(57) ABSTRACT

A method of transferring data from a first circuit block to a second circuit block, includes, in part, sampling the data using a first clock signal during a first cycle, compressing the sampled data at the first circuit block and using a compression ratio. In response to a determination that the compression ratio is equal to or less than a threshold value, selecting the compressed data for transmission to the second circuit block, and selecting a second clock signal for sampling the data during a second cycle. The phase of the second clock signal relative to a phase of the first clock signal is determined in accordance with the compression ratio.

20 Claims, 5 Drawing Sheets

DYNAMIC CLOCK SCALING USING COMPRESSION AND SERIALIZATION

RELATED APPLICATION

The present application claims benefit under 35 USC 119 (e) of U.S. Patent Application No. 63/218,849, filed Jul. 6, 2022, the content of which is incorporated herein by reference in its entirety.

TECHNICAL FIELD

The present disclosure relates to integrated circuits, and more particularly to dynamic scaling of clock signals used in integrated circuits.

BACKGROUND

System validation and software development consume a significant amount of time in designing and developing an integrated circuit (IC). Field programmable gate array (FPGA) prototyping systems may be used to accelerate the development of an IC. The period of a design clock of an IC has a direct impact on the total test runtime of the IC. The clock period depends, in part, on the timing of the critical paths of the design. In FPGA prototyping, an IC design is often partitioned and mapped into a multitude of FPGA chips. The signals from one FGPA chip is transferred to another FPGA chip using a serializer-deserializer circuit, commonly referred to as SerDes.

SUMMARY

A method of transferring data from a first circuit block to a second circuit block, in accordance with one embodiment of the present disclosure, includes, in part, sampling the data using a first clock signal during a first cycle; compressing the sampled data at the first circuit block and using a compression ratio; and responsive to a determination that the compression ratio is equal to or less than a threshold value: selecting the compressed data for transmission to the second circuit block; and selecting a second clock signal for sampling the data during a second cycle. The phase of the second clock signal relative to a phase of the first clock signal is determined in accordance with the compression ratio.

In one embodiment, the method further includes, in part, selecting a multiplexing factor for a serializer circuit disposed in the first circuit block in accordance with the compression ratio. In one embodiment, the method further includes, in part, applying the compressed data to a first input terminal of a multiplexer; applying the data to a second input terminal of the multiplexer; and applying a signal representative of the compression ratio to a select terminal of the multiplexer.

In one embodiment, the method further includes, in part, generating the second clock signal from a reference clock signal. In one embodiment, the method further includes, in part, generating a third clock signal from the reference clock signal; and selecting the third clock signal for sampling the data during a third cycle. The phase of the third clock signal is shifted relative to phases of the first and second clock signals.

In one embodiment, the method further includes, in part, supplying an output of the multiplexer to the serializer circuit; and supplying an output of the serializer circuit to a deserializer circuit disposed in the second circuit block. In one embodiment, the method further includes, in part, selecting a demultiplexing factor for the deserializer circuit in accordance with the compression ratio. In one embodiment, the method further includes, in part, delivering the output of the deserializer circuit to a demultiplexer. In one embodiment, the method further includes, in part, supplying the data at a first output terminal of the demultiplexer; and supplying the compressed data at a second output terminal of the demultiplexer. In one embodiment, the method further includes, in part, decompressing the compresses data supplied at the second output terminal of the demultiplexer in accordance with the compression ratio.

A circuit, in accordance with one embodiment of the present disclosure, includes, in part, a data compression block configured to compress received data using a compression ratio; and a decision block configured to cause, in response a determination that the compression ratio is equal to or less than a threshold value: a selection of the compressed data for transmission from a first circuit block to a second circuit block; and a selection of a second clock signal for sampling the data during a second cycle. The phase of the second clock signal relative to a phase of the first clock signal is determined in accordance with the compression ratio.

In one embodiment, the circuit further includes, in part, a serializer circuit having a multiplexing factor selected in accordance with the compression ratio. In one embodiment, the circuit further includes, in part, a multiplexer that has a first input terminal receiving the compressed data; a second input terminal receiving the data; and a select terminal receiving a signal representative of the compression ratio. In one embodiment, the circuit further includes, in part, a clock generator generating the second clock signal from a reference clock signal.

In one embodiment, the clock generator generates a third clock signal from the reference clock signal. The decision block is further configured to cause a selection of the third clock signal for sampling the data during a third cycle. The phase of the third clock signal is shifted relative to phases of the first and second clock signals. In one embodiment, the multiplexer has an output terminal coupled to an input terminal of the serializer circuit. The serializer circuit has an output terminal coupled to an input terminal of a deserializer circuit disposed in the second circuit block.

In one embodiment, the deserializer circuit has a demultiplexing factor selected in accordance with the compression ratio. In one embodiment, the circuit further includes, in part, a demultiplexer receiving an output of the deserializer circuit. In one embodiment, the demultiplexer includes, in part, a first output terminal supplying the data; and a second output terminal supplying the compressed data. In one embodiment, the circuit further includes, in part, a decompression block configured to decompresses the data supplied at the second output terminal of the demultiplexer in accordance with the compression ratio.

BRIEF DESCRIPTION OF THE DRAWINGS

The disclosure will be understood fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Validation of the functionality of an IC or a System-on-Chip (SoC) design often consumes a considerable amount of time and resources. One technique for testing and validation of a circuit design is through prototyping of the design using FPGAs. Given the complexity of current designs and the number of transistors that may be present in such designs, the runtime test of an FPGA-based prototype can be substantial, particularly when the design may undergo multiple iterations and revisions. The test runtime is directly related to the period of the clock used during the test.

Signal transfer between different FPGAs of a prototyped design is often carried out using a number of SerDes components (also referred to herein as Serdes circuits or Serdes). A data path spanning across multiple FPGAs may therefore include a number of SerDes circuits. The delay across a SerDes increases with the number of signals being serialized. Accordingly, a SerDes may become a bottleneck for achieving a reduced clock period.

Embodiments of the present disclosure overcome the delay bottleneck caused by a SerDes by dynamically scaling the clock and using compression. Compression of the data before serialization reduces the number of data bits that are sent to a SerDes, thereby reducing the delay. In some embodiment, when compression alone does not provide a sufficiently small number of bits for all data patterns, a dynamic clock period is used. In such embodiments, during each design clock cycle, depending on the compression achieved, a phase shifted version of the design clock is selected for the subsequent cycle. Embodiments of the present disclosure, therefore, substantially reduce the overall test runtime, in turn, resulting in significant cost savings.

As was described above, the delay through a SerDes is proportional to the number of signals being serialized. In accordance with one embodiment, to reduce or minimize the delay through a SerDes so as to decrease the test runtime, the SerDes is configurable to select between different data signal ratios resulting in different delays. To further reduce the delay, the data signals may be compressed to reduce the number of data bits that are to be serialized. Moreover, in some embodiment, the SerDes is dynamically configured per clock cycle for different input signal widths. In some embodiments, for relatively smaller signals widths, a number of circuits disposed in the SerDes may be bypassed to further reduce the delay.

Figure 1:
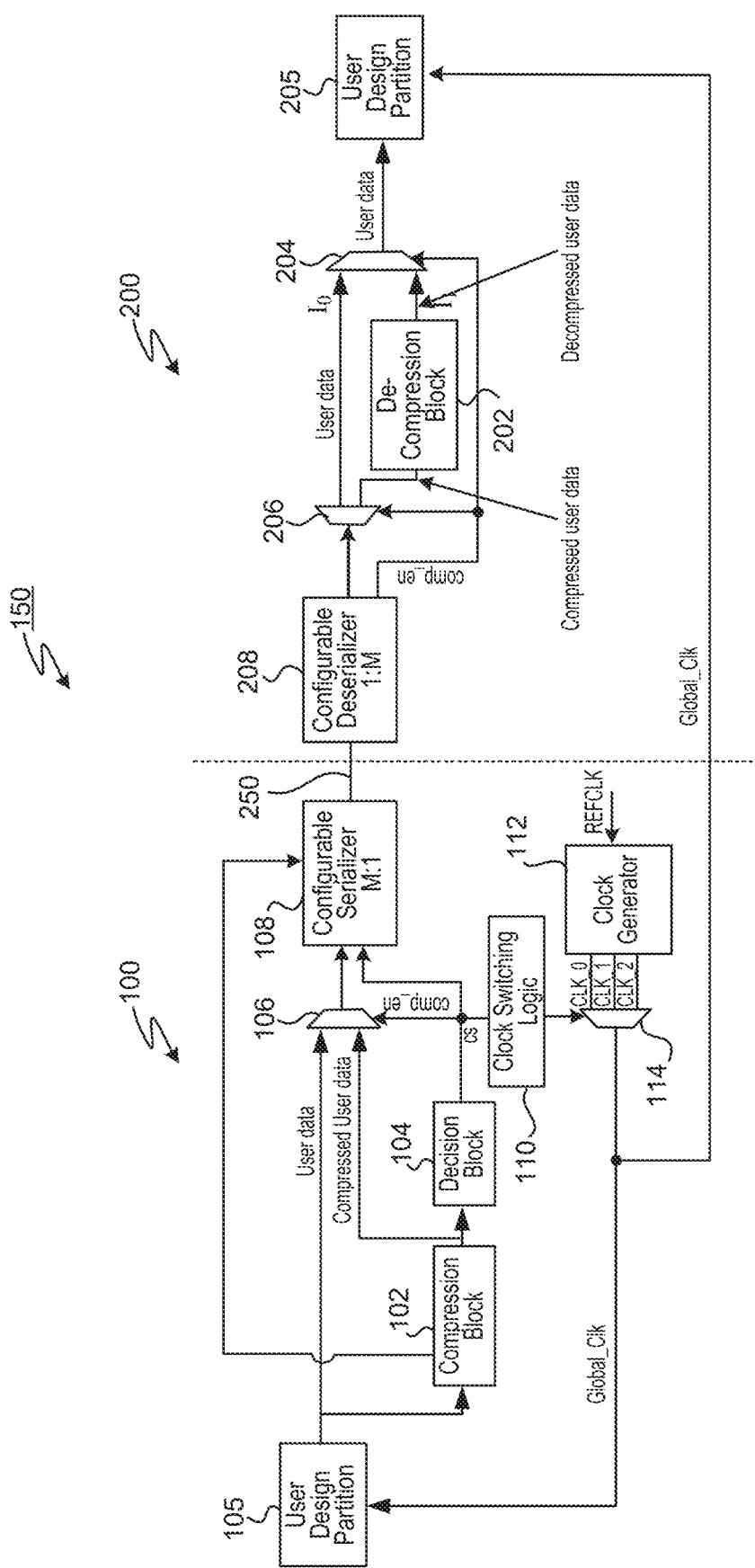
FIG. 1 is a schematic diagram of a circuit for dynamic clock scaling, and compression of data to be serialized and deserialized, in accordance with some embodiments of the present disclosure.

FIG. 1 is a schematic diagram of a circuit 150, in accordance with one exemplary embodiment of the present disclosure. Circuit 150 is shown as including a first circuit 100 that serializes the data, and a second circuit 200 that deserializes the data in accordance with embodiments of the present disclosure. The following description of the embodiments of the present disclosure are provided with reference to each of circuits 100 and 200 as being an FPGA that is configured to represent a circuit design for prototyping and testing. It is understood, however, that embodiments of the present disclosure apply to any other type of circuitry, FPGA or otherwise.

Circuit 100 is shown as including, in part, a compression block 102, a decision block 104, a multiplexer 106 that receives partitioned user design data 105, a configurable serializer 108, a clock switching block 110, a clock generator 112, and a multiplexer 114. Circuit 200 is shown as including, in part, a configurable deserializer 208, a demultiplexer 206, a decompression block 202, and a multiplexer 204.

Configurable serializer 108 converts the N-bit parallel data received from multiplexer 106 to a 1-bit serialized bit stream. In one embodiment, configurable serializer 108 includes a dynamically configurable multiplexer with a multiplexing ratio (also referred to herein as multiplexing factor) M:1 that is dynamically configurable, where M may be a positive integer equal to or less than N (e.g., N, N−1 . . . 1), or may be a number defined by a division of N by an even number, e.g. N/2. The delay across configurable serializer 108 is proportional to the multiplexing ratio M. For example, if the received data is 16 bits wide, and the serializer's multiplexer supports two ratios of M=16 and M=8, then the delay across serializer 108 is greater when M is set to 16 than when M is set to 8. The value of M is determined in accordance with the compression ratio as determined by compression block 102, as described further below, and delivered to configurable serializer 103 by compression block 102.

Configurable deserializer 208 converts the 1-bit serial data stream received from configurable serializer 108 to an N-bit data. In one embodiment, configurable deserializer 208 includes a dynamically configurable demultiplexer with a demultiplexing ratio (also referred to herein as demultiplexing factor) 1:M that is dynamically configurable, where M may be a positive integer equal to or less than N (e.g., N, N−1 . . . 1), or may be a number defined by a division of N by an even number, e.g. N/2. The delay across configurable deserializer 208 is proportional to the demultiplexing ratio M. For example, if the deserializer's demultiplexer supports two demlutiplexing ratios M=16 and M=8, then the delay across deserializer 208 is greater when M is set 16 than when M is set to 8. The value of M is determined in accordance with the compression ratio as determined by compression block 102, as described further below, and delivered to configurable serializer 103 via signal line 250.

User design data 105, that has been mapped into various components of FPGA 100, is delivered to compression block 102 and to a first input of multiplexer 106. Compression block 102, when instructed to perform compression of the received N-bit data stream (also referred to herein as N-bit vector), generates compressed data and provides the compression ratio. The compressed data is provided to a second input of multiplexer 106. Compression block 102 may perform any compression algorithm, such as run length encoding, Huffman encoding, and the like.

Compression block 102, as well as decision block 104 described further below, operate using a clock that is faster than the clock supplying user data 105, referred to herein as the user clock. For example, in one embodiment, the user clock may be a 10 MHz clock, whereas the clock signal applied to compression block 102 and decision block 104 may be a 200 MHz clock.

The timing associated with the user data is such that it reaches the compression block within a specified time. Although not shown, an edge detection logic is used to detect the edges (e.g., rising edge) of the user clock, which in turn, is used by the compression block as a data valid indicator. The detected edge reaches the compression block after the specified time delay. This ensures that the user data is stable when the detected edge is sampled by compression block.

Decision block 104 receives compression-related information from compression block 102 and, in response, generates, in part, signal comp_en to multiplexer 106 to indicate whether the compressed data or the raw data (i.e., the uncompressed data) is to be selected in a current design clock cycle. For example, if comp_en is 0, multiplexer 106 delivers the raw user data to configurable serializer 108. If, on the other hand, comp_en is 1, multiplexer 106 delivers the compressed data to configurable serializer 108. Although not shown, decision block 104 provides other information required to perform decompression (by decompression block 202), and the like, through data path 250 between serializer 108 and deserializer 208.

In response to the data received from compression block 102, decision block 104 provides, in part, signal CS which decision block 104 applies to clock switching block 110. For example, if the compression ratio used by compression block 102 is less than or equal to a threshold value, decision block 110 may set signal CS to a first value. If the compression ratio used by compression block 102 is greater than a threshold value, decision block 110 may set signal CS to a second value. For example, if such a threshold value is 0.75, then in one example:

$$CS=1, \text{ if } r<=0.75 \quad (1)$$

$$CS=0, \text{ if } r>0.75 \quad (2)$$

where 'r' represents the compression ratio (e.g., compressed size/raw size).

In other embodiments, multiple threshold values defining multiple ranges may be used to set signal CS to any number of predefined values. For example, depending on the threshold values and the compression ratios, signal CS may be set to any one of k different values, where k is an integer greater than or equal to 2.

Decision block 104 is also adapted to provide signal CS to clock switching block 110 to indicate the phase of the clock to be selected and used for serialization of the data. Clock generation block 112 receives the reference clock signal REFCLK, and in response, generates a multitude of phase shifted clock signals, three of which, namely clock signals CLK_0, CLK_1, and CLK_2 having phases of 0°, 180°, and 270° relative to the phase of clock REFCLK are shown. Although clock generation block 112 is shown as generating three phase-shifted clock signals, it is understood that clock generation block 112 may generate any number of clocks each having a different degree of phase shift relative to the phase of clock signal REFCLK.

In response to the value of the compression ratio and as represented by signals CS, clock switching block 110 selects, through multiplexer 114, one of the phase shifted clock signals generated by clock generation block 112. For example, if the compression ratio falls in the range (0 to 0.5) CLK_1 is selected by multiplexer 114 for the next clock cycle. If the compression ratio falls in the range (0.5 to 0.75), then CLK_2 is selected by multiplexer 114 for the next cycle. If the compression ratio falls in the range (0.75 to 1), then there is no change in clock selection for the next cycle. Because the clock signals generated by clock generation block 112 are phase shifted with respect to one another, by changing the selected clock, the period of the clock signal Global_Clk applied to the user design data 105 and user design data 205 is dynamically scaled, thus resulting in substantially reduced test runtime and cost, as described further below.

The receiving block 200 need not wait for the global clock signal Global_Clk to perform its operations. As is described further below, the global clock signal has a period determined based on the worst case compression ratio (i.e., the least compressed) among all the links. Therefore, such blocks may use the locally received compression information for their operations. Since the global clock is selected for the worst case compression ratio, it is guaranteed that the next selected clock will satisfy the timing requirements associated with various blocks of each local operation.

Due to the dynamic scaling of the period of clock signal Global_Clk, each clock cycle may have a different clock period depending on whether the compression ratio meets the threshold values, as described above. The total reduction in the test runtime thus depends on the percentage of cycles during which compression is applied to the data.

For example, assume that during 40% of the cycles, the compression ratio has a value in the range (0, 0.5); during 30% of cycles the compression ratio has a value in the range (0.5, 0.75); and during the remaining 30% of the cycles the compression ratio has a value in the range (0.75 to 1). If a test takes A cycles to complete, and if "T" is the original cycle period using a conventional scheme that does not benefit from embodiments of the present disclosure, then the reduced test runtime with dynamic scaling and compression, in accordance with embodiments of the present disclosure, may be expressed as below:

$$A*T*[(0.4/2)+(0.3*3/4)+(0.3)]=0.675*A*T \quad (3)$$

As can be seen from expression (3), embodiments of the present disclosure reduce the runtime of the above test by 32.5%. Long test time running into days/weeks are not uncommon in prototyping, therefore, the savings in runtime resulting from embodiments of the present disclosure may be substantial.

Configurable deserializer 208 converts the 1-bit serial data stream received from configurable serializer 108 to an N-bit data and supplies the N-bit data to the data input terminal of demultiplexer 206. Configurable deserializer 208 supplies signal comp_en, described above, to the select terminal of demultiplexer 206. Any N-bit data that has not been compressed is delivered to input terminal $I_0$ of multiplexer 204. Compressed data supplied by demultiplexer 206 is received and decompressed by de-compression block 202 and subsequently delivered to input terminal $I_1$ of multiplexer 204. In response to signal comp_en, either the data present at terminal $I_0$, or the data present at terminal of $I_1$ of multiplexer 204 is delivered as user data partition 205.

Figure 2:
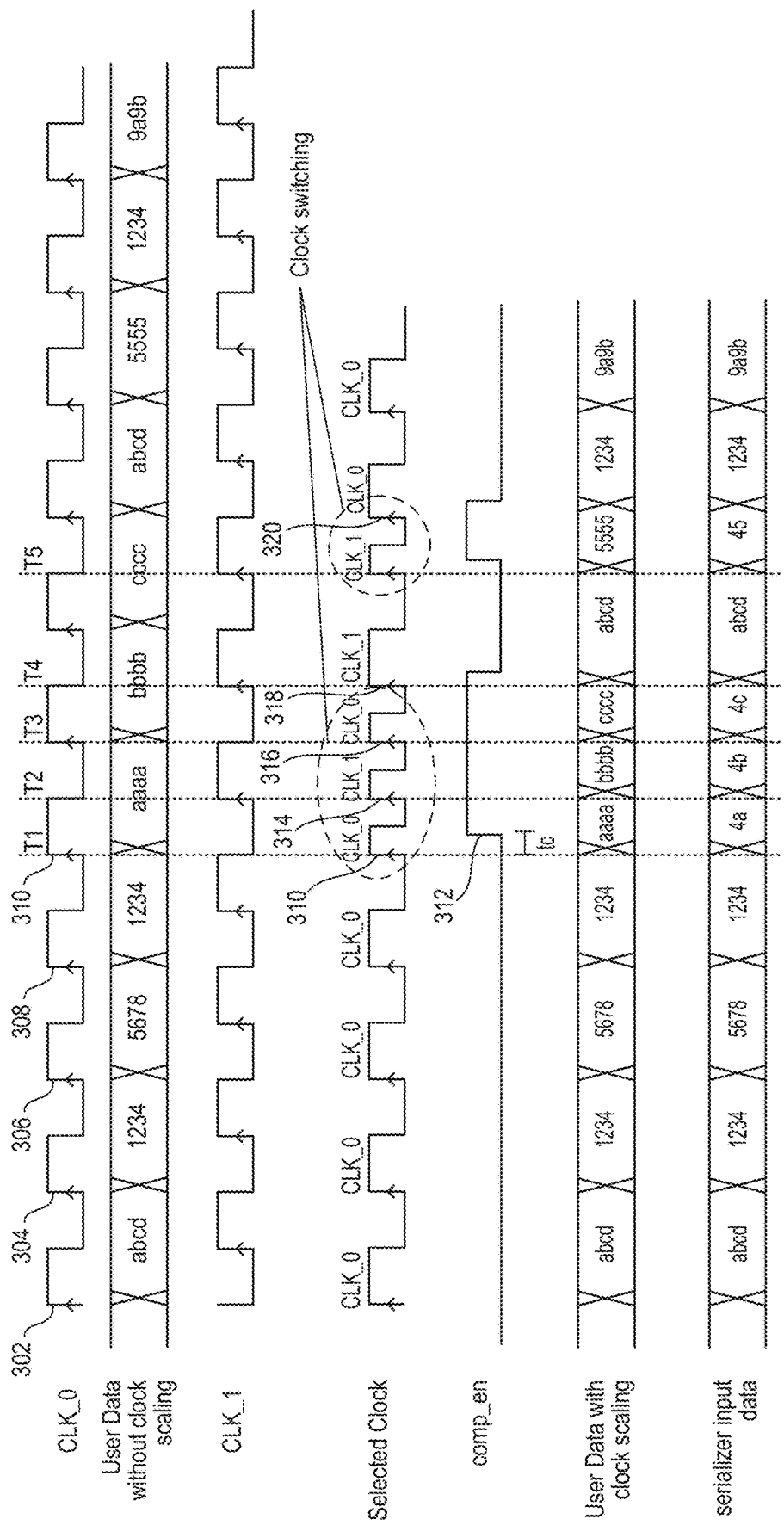
FIG. 2 shows the timing diagram of a number of signals associated with the circuit shown in FIG. 1.

FIG. 2 is a timing diagram of a number of signals associated with the circuit blocks shown in FIG. 1. In FIG. 2, "User data without clock scaling" represents a traditional scheme of launching and capturing data across the FPGAs. The data is launched on each rising edge of clock signal CLK_0 and captured on the next successive edge. For example, in response to the rising edges 302, 304, 306, 308 and 310 of signal CLK_0, hexadecimal data "abcd", "1234", "5678", "1234", and "aaaa" are shown as being captured.

In accordance with embodiments of the present disclosure, and as shown further in FIG. 2, clock signal CLK_0, as well clock signal CLK_1 which has a 180° phase shift relative to clock signal CLK_0, are both used to capture and process the data.

Referring concurrently to FIGS. 1 and 2, at time T1, corresponding to the rising edge 310 of clock signal CLK_0, user design data "aaaa" is sampled. The data is compressed (e.g., by compression block 102 of FIG. 1) to "4a" using exemplary run-length encoding compression scheme. The compression reduces the received 16-bit hexadecimal data "aaaa" to an 8-bit data "4a" which is supplied to the serializer and labeled as "serializer input data" in FIG. 2.

Because the data received at T1 gets compressed, signal comp_en is asserted at 312, thereby causing clock switching block 110 to select clock signal CLK_1 at 314. Because clock signal CLK_1 has a 180° phase shift relative to signal CLK_0, switching of the clock signal advances the operation by half a clock cycle of CLK_0.

At time T2, user design data "bbbb" is detected. Data "bbbb" is compressed to "4b", thereby causing the selected clock to switch again from CLK_1 to CLK_0 at 316. Accordingly, only half of the clock period is consumed in capturing and delivering the data "4b' to serializer 108.

At time T3, user design data "cccc" is detected. The data is compressed to "4c", thereby causing the selected clock to switch again from CLK_0 to CLK_1 at 318. Accordingly, only half of the clock period is consumed in capturing and delivering the data "4b' to serializer 108.

At time T4, user design data "abcd" is detected. Because this data is not compressed, signal CLK_1 is not switched, and therefore a full clock period is consumed in capturing and delivering the data.

At time T5, user design data "5555" is detected. The data is compressed to "45", thereby causing the selected clock to switch back from CLK_1 to CLK_0 at 320. Accordingly, only half of the clock period is consumed in capturing and delivering the data "45' to serializer 108. After time T5, signal CLK_0 remains selected and is not switched as the data is not suitable for compression. Therefore a full clock period is consumed in capturing and delivering the data.

As described in the example above, at T1, T2, T3 and T5 only half of the clock period is used in processing of the data, and therefore, the overall runtime of the test is reduced. Embodiments of the present disclosure, therefore, reduce the average clock period used in serializing and deserializing the data. The inverse of the process described above is performed at the de-serializer to reconstruct the user data.

Figure 3:
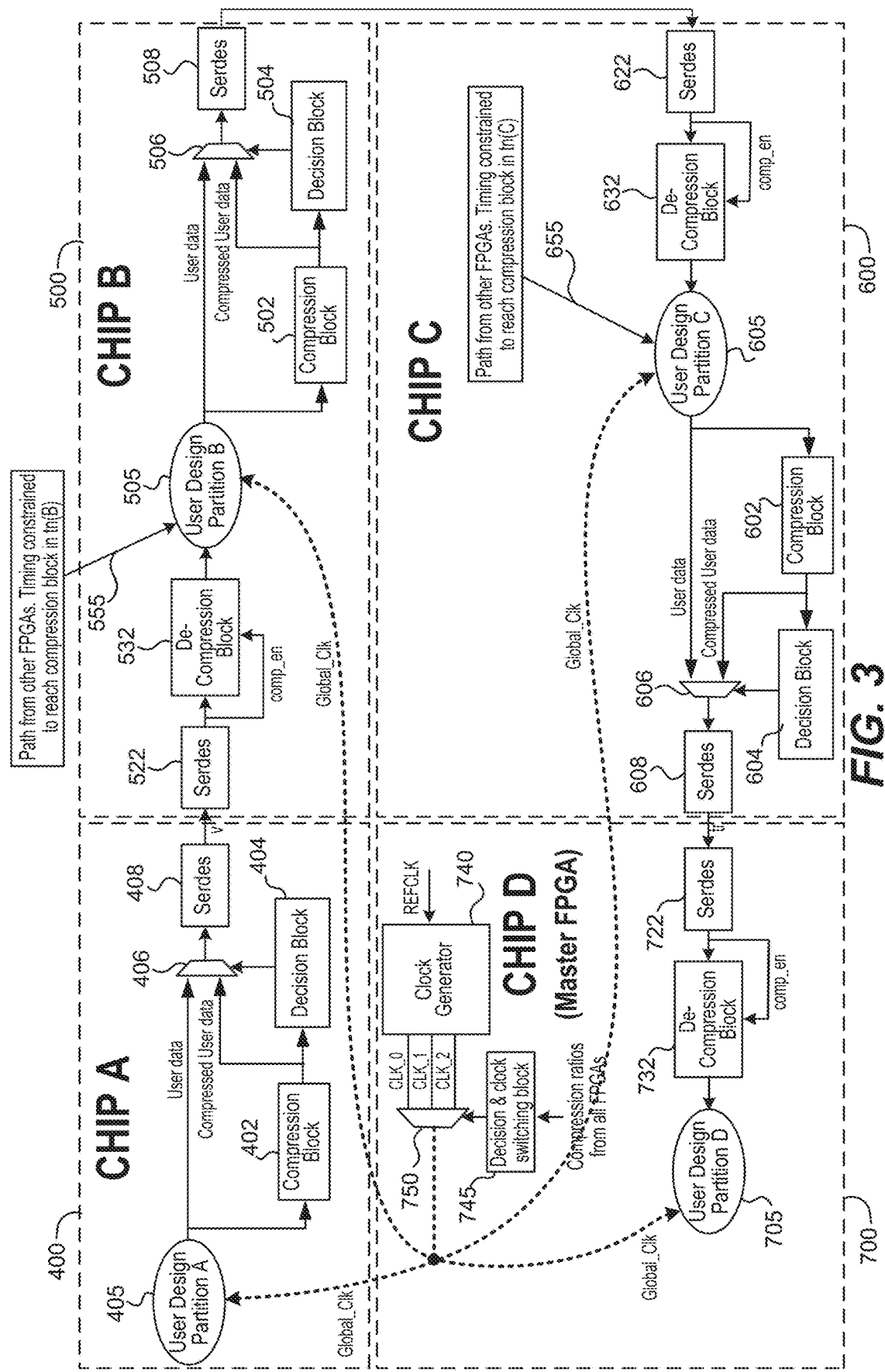
FIG. 3 is a schematic diagram of a circuit for dynamic clock scaling, and compression of data to be serialized and deserialized, in accordance with some embodiments of the present disclosure.

FIG. 3 is schematic diagram of four FPGAs 400, 500, 600 and 700 that have been configured with user data to represent a circuit design for prototyping and testing, in accordance with another embodiment of the present disclosure. Although Figure shows four FPGAs that have been configured to represent a circuit design, it is understood that embodiments of the present disclosure equally apply to any number of FPGAs.

FPGA 400 is configured with partitioned user design data A 405. FPGA 400 is also shown as including, in part, a compression block 402, a decision block 404, a multiplexer 406, and a configurable SerDes 408. FPGA 500 is shown as having been configured with partitioned user design data B 505. FPGA 500 is also shown as including, in part, a first configurable SerDes 522, a decompression block 532, a compression block 502, a decision block 504, a multiplexer 506, and a second configurable SerDes 508. FPGA 600 is shown as having been configured with partitioned user design data C 605. FPGA 600 is also shown as including, in part, a first configurable SerDes 622, a decompression block 632, a compression block 602, a decision block 604, a multiplexer 606, and a second configurable SerDes 608. FPGA 700 is also shown as including, in part, a first configurable SerDes 622, a decompression block 632, a compression block 602, a decision block 604, a multiplexer 606, and a second configurable SerDes 608. FPGA 700 is shown as having been configured with partitioned user design data D 705. FPGA 700 is also shown as including, in part, a configurable SerDes 722, a decompression block 732, a clock generator (e.g., a phase locked loop) 740, a decision and clock switching block 745, and a multiplexer 750. compression block 602, a decision block 604, a multiplexer 606, and a second configurable SerDes 608. FPGA 700 is also shown as including, in part, a first configurable SerDes 622, a decompression block 632, a compression block 602, a decision block 604, a multiplexer 606, and a second configurable SerDes 608.

The compression blocks, decision blocks, decompression blocks and the multiplexers operate in the same manner as described above with reference to FIG. 1. Furthermore, each SerDes includes a Serializer and a deserializer as was also described above. In the exemplary embodiment shown in FIG. 3, FPGA 700 is selected as the master FPGA which generates the global clock signal Global_Clk that is applied to control the sampling of data 405, 505, 605, and 705 as shown. As is also shown from FIG. 3, data is transferred, in part, from FPGA 400 to FPGA 500, from FPGA 500 to FPGA 600, and from FPGA 600 to FPGA 700. Furthermore, data from other FPGAs (not shown in FIG. 3) may be supplied to, for example, FPGA 500 via path 555 and to FPGA 600 via path 655.

Clock generation circuit 740 is shown as generating three clock signals, namely clock signals CLK_0, CLK_1 and CLK_2 that are assumed to have phase shifts of 90°, 180°, and 270° relative to phase of the reference clock signal REFCLK. It is understood, however, that clock generation circuit 740 may generate any number of clock signals each having a phase shift relative to clock signal REFCLK that is different from 90°, 180°, and 270°. In the following, the delay across each compression block is represented as tc, and the delay across each decision block is represented as td.

In accordance with one aspect of the present disclosure, to select from clock signals CLK_0, CLK_1 and CLK_2, the following is performed. For each user design data path there are one or more hops through the Serdes. For each hop through a SerDes, the compression ratio and its corresponding delay are determined. For example, the user design Data 405 hops, in part, through SerDes blocks 408, 522, 508, 622, 608 and 722 Therefore, compression ratios, and their corresponding delays associated with FPGAs 400, 500 and 600 are determined for design data 405. Thereafter, the sum of the delays associated with all the hops is computed; represented herein as parameter D. Next, the worst case delay (i.e., the longest) tworst among all the N paths is determined tworst=maximum (D).

Next, the effective clock period t_eff is determined in accordance with the expression minimum {(tworst+ts), tuser}, where ts represents the longest propagation delay from the final compression block of the user data path to the clock switching block 745 (i.e., the delay from compression block 602 to clock switching block 745), and tuser represents the period of the clock (not shown in FIG. 3) that is used to sample the user data, such as user data 405. Next, the phase shift (in degrees) of the clock is determined as:

$$\text{clock phase shift} = 360 \times \frac{t\_eff}{tuser} \quad (4)$$

Next, the clock having the phase shift as determined using expression (4) is selected by decision and switching block 745.

Timing constraints are used to ensure that the data is stable at the input of each compression block. In cases where the user data traverses multiple FPGAs, the timing constraints are also accordingly partitioned on multiple FPGA devices as shown in FIG. 3, where the user data is partitioned into user data 405, 505, 605 and 705. The times at which the data is stable is accounted for and managed by the timing budgeting both within an FPGA and across multiple FPGAs. Because global clock signal Global_Clk is selected based on the worst case compression, having different compression ratios has no impact. Within each FPGA, the local compression information is used for the FPGA's datapath. In FIG. 3, the path delay from user design partition A 405 of FPGA 400 to user design partition D 705 of FPGA 700 is smaller than tmin, which represents the minimum clock period corresponding to the minimum compression ratio.

In accordance with one aspect of the present disclosure, to determine when a current cycle is over and a new cycle is to start, the following is performed. At time T, the rising edge of the user clock associated with a current cycle is assumed to occur. At time T+tn (A), user data 405 reaches compression block 404 of FPGA 400 (and possibly from other FPGA's). At time T+tn (B), user data 405 reaches compression block 502 of FPGA 500 (and possibly from other FPGA's). At time T+tn (C), user data 405 reaches compression block 602 of FPGA 600 (and possibly from other FPGA's). At time T+tn (C)+tc+td, a decision is made about which clock signal to select based on the compression ratio, where tc represents the delay though the compression block, and td represents the delay though the decision block. Because the time at which a new clock selection decision reaches the clock multiplexer 750 is prior to the edge of any of the phase shifted clock, sufficient time exists to switch to the desired clock. The next clock edge will subsequently start when the rising edge of the selected phase shifted clock occurs.

Figure 4:
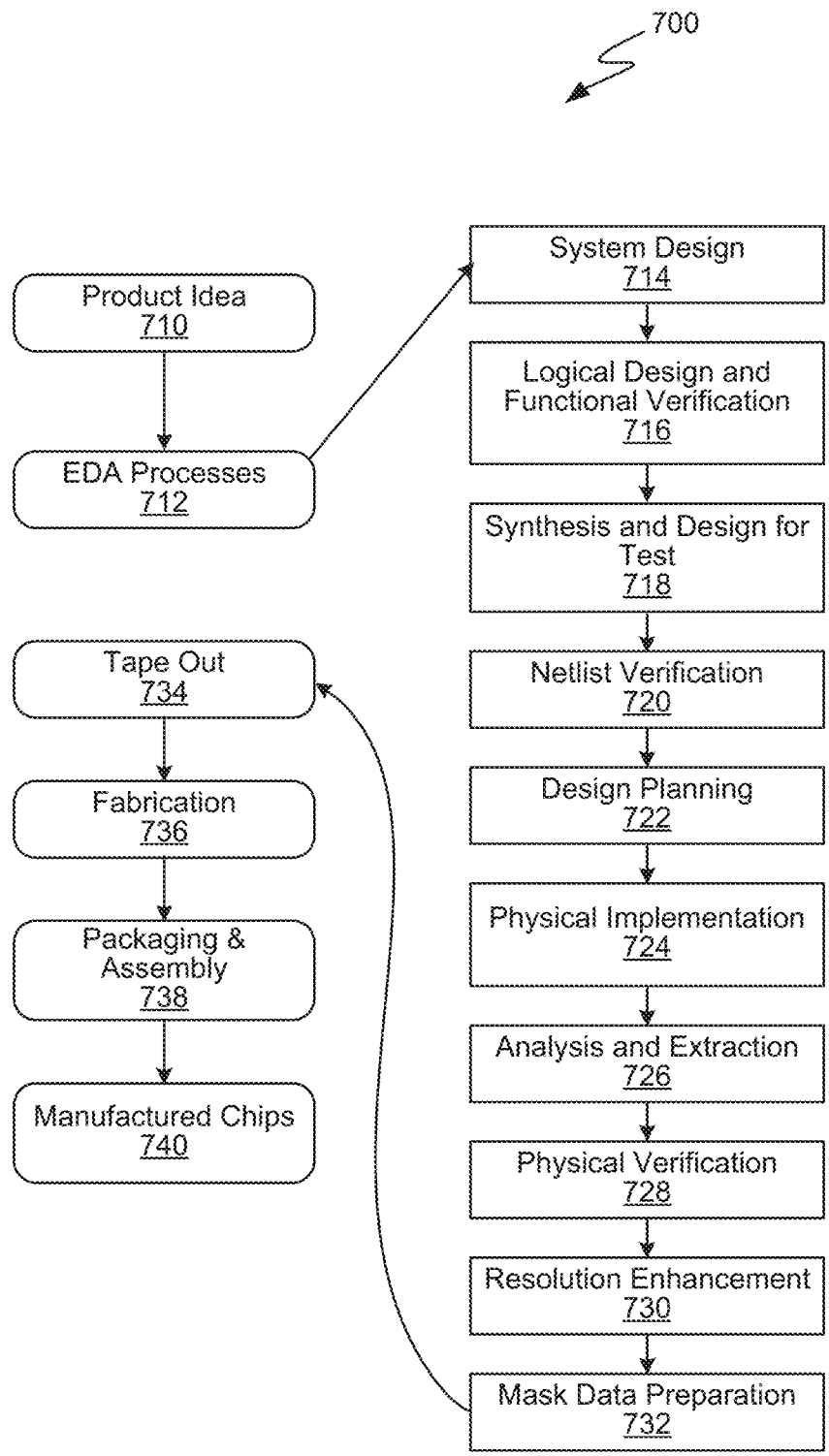
FIG. 4 depicts a flowchart of various processes used during the design and manufacture of an integrated circuit in accordance with some embodiments of the present disclosure.

FIG. 4 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 5. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 900 of FIG. 6) may be used to store the programs and data structures that are used by some or all of the EDA products described herein, and products used for development of cells for the library and for physical and logical design that use the library.

Figure 5:
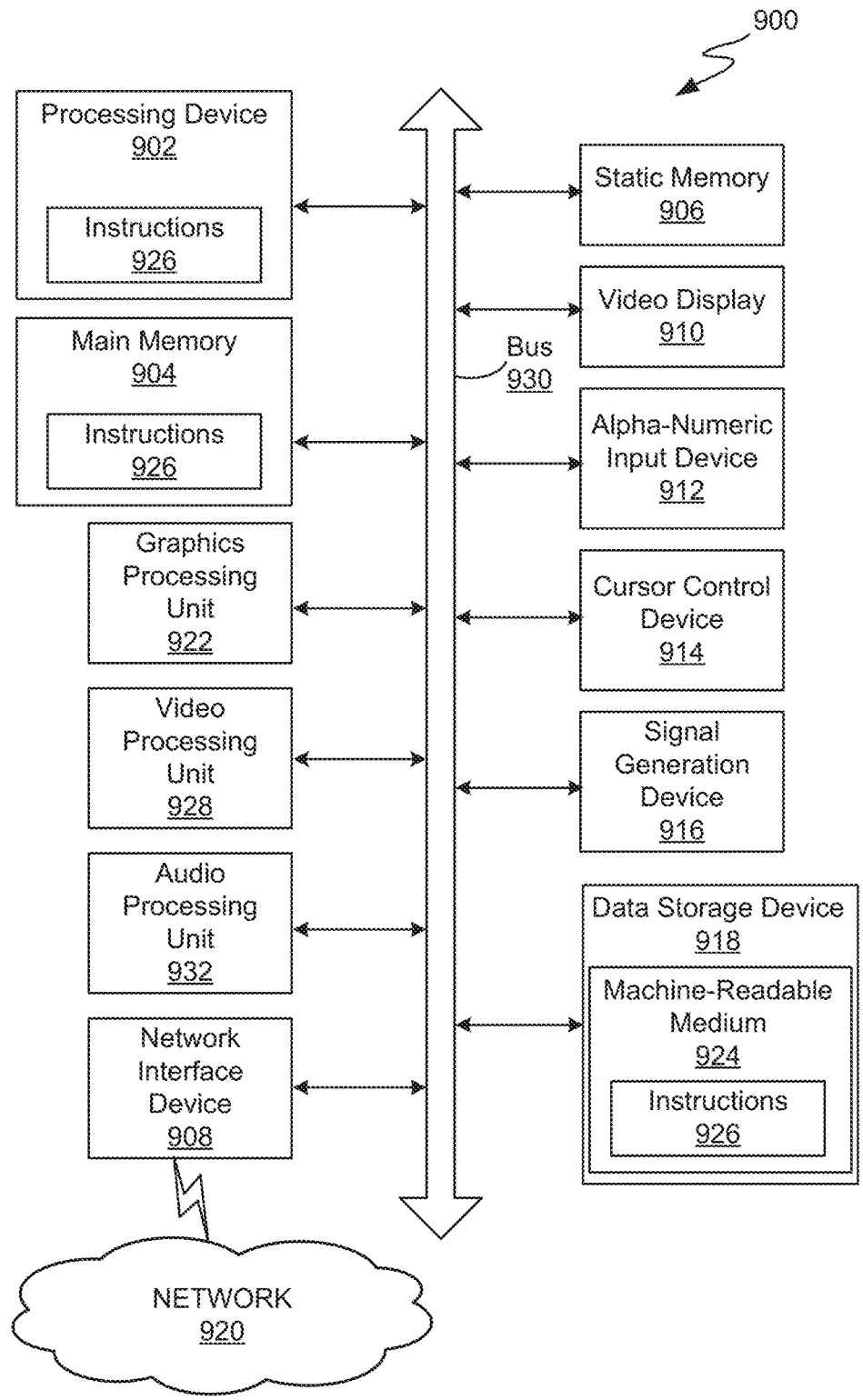
FIG. 5 depicts a diagram of an example computer system in which embodiments of the present disclosure may operate.

FIG. 5 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

The invention claimed is:

1. A method of transferring data from a first circuit block to a second circuit block, the method comprising:
sampling the data using a first clock signal during a first cycle;
compressing the sampled data at the first circuit block and using a compression ratio; and
responsive to a determination that the compression ratio is equal to or less than a threshold value:
selecting the compressed data for transmission to the second circuit block; and
selecting a second clock signal for sampling the data during a second cycle, wherein a phase of the second clock signal relative to a phase of the first clock signal is determined in accordance with the compression ratio.

2. The method of claim 1 further comprising:
selecting a multiplexing factor for a serializer circuit disposed in the first circuit block in accordance with the compression ratio.

3. The method of claim 2 further comprising:
applying the compressed data to a first input terminal of a multiplexer;
applying the data to a second input terminal of the multiplexer; and
applying a signal representative of the compression ratio to a select terminal of the multiplexer.

4. The method of claim 3 further comprising:
generating the second clock signal from a reference clock signal.

5. The method of claim 4 further comprising:
generating a third clock signal from the reference clock signal; and
selecting the third clock signal for sampling the data during a third cycle, wherein a phase of the third clock signal is shifted relative to phases of the first and second clock signals.

6. The method of claim 4 further comprising:
supplying an output of the multiplexer to the serializer circuit; and
supplying an output of the serializer circuit to a deserializer circuit disposed in the second circuit block.

7. The method of claim 6 further comprising:
selecting a demultiplexing factor for the deserializer circuit in accordance with the compression ratio.

8. The method of claim 7 further comprising:
delivering an output of the deserializer circuit to a demultiplexer.

9. The method of claim 8 further comprising:
supplying the data at a first output terminal of the demultiplexer; and
supplying the compressed data at a second output terminal of the demultiplexer.

10. The method of claim 9 further comprising:
decompressing the compressed data supplied at the second output terminal of the demultiplexer in accordance with the compression ratio.

11. A circuit comprising:
a data compression block configured to compress received data using a compression ratio; and
a decision block configured to cause, in response to a determination that the compression ratio is equal to or less than a threshold value:
a selection of the compressed data for transmission from a first circuit block to a second circuit block; and
a selection of a second clock signal for sampling the data during a second cycle, wherein a phase of the second clock signal relative to a phase of the first clock signal is determined in accordance with the compression ratio.

12. The circuit of claim 11 further comprising:
a serializer circuit having a multiplexing factor selected in accordance with the compression ratio.

13. The circuit of claim 12 further comprising a multiplexer including:
a first input terminal receiving the compressed data;
a second input terminal receiving the data; and
a select terminal receiving a signal representative of the compression ratio.

14. The circuit of claim 13 further comprising:
a clock generator generating the second clock signal from a reference clock signal.

15. The circuit of claim 14 wherein the clock generator generates a third clock signal from the reference clock signal, and wherein the decision block is further configured to cause a selection of the third clock signal for sampling the data during a third cycle, wherein a phase of the third clock signal is shifted relative to phases of the first and second clock signals.

16. The circuit of claim 14 wherein the multiplexer has an output terminal coupled to an input terminal of the serializer circuit, and wherein the serializer circuit has an output terminal coupled to an input terminal of a deserializer circuit disposed in the second circuit block.

17. The circuit of claim 16 wherein the deserializer circuit has a demultiplexing factor selected in accordance with the compression ratio.

18. The circuit of claim 17 further comprising:
   a demultiplexer receiving an output of the deserializer circuit.

19. The circuit of claim 18 wherein the demultiplexer comprises:
   a first output terminal supplying the data; and
   a second output terminal supplying the compressed data.

20. The circuit of claim 19 further comprising:
   a decompression block configured to decompress the compressed data supplied at the second output terminal of the demultiplexer in accordance with the compression ratio.

* * * * *